Dec. 17, 1968 E. W. THOMAS 3,417,263

LOGARITHMIC AMPLIFIER

Filed March 18, 1965

INVENTOR

Edward W. Thomas

BY

De Lio and Montgomery

ATTORNEYS 3,417,263
LOGARITHMIC AMPLIFIER

Edward W. Thomas, Cheshire, Conn., assignor to Ansitron, Inc., a corporation of Connecticut Filed Mar. 18, 1965, Ser. No. 440,827
4 Claims. (Cl. 307—229)

ABSTRACT OF THE DISCLOSURE

This invention is directed to a logarithmic amplifier using a first diode having a logarithmic current voltage characteristic. In particular, this invention is concerned with compensating for the effect of high repetition rate monopolar pulse input signals on the average direct current biasing the diode. In the preferred embodiment, a DC bias current is established through a reference diode having substantially the same characteristic as the first diode. The voltage drops across both diodes are sensed and thereafter these voltages are compared to develop an error signal to control the DC bias current through the first diode.

Figures 1, 2:
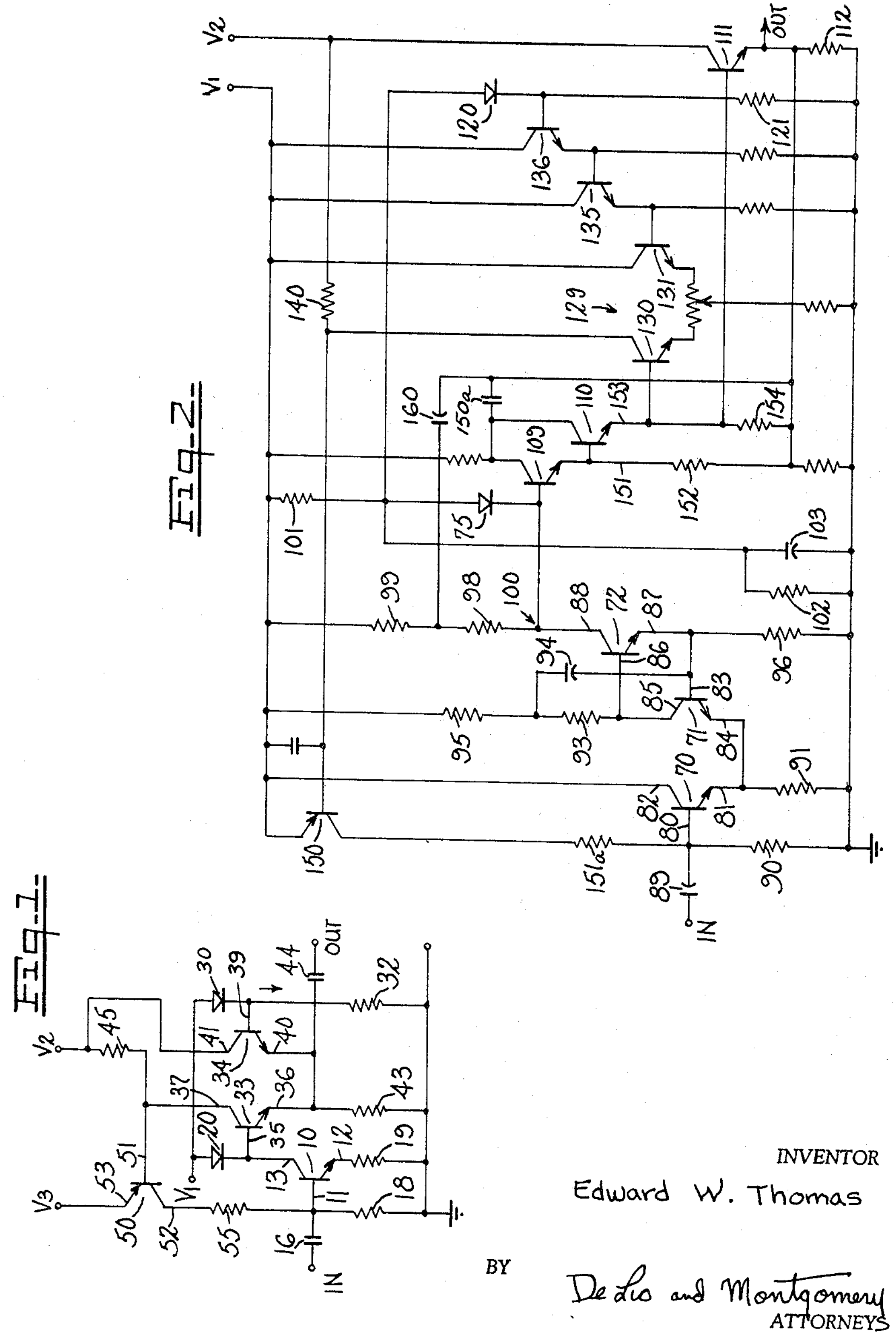

This invention relates to energy amplifiers and more particularly to an improved electronic logarithmic amplifying device.

Amplifiers which are capable of converting an input signal to an output signal proportional to the logarithm of the amplitude of the input signal, are often used in radar display systems, in radar range determining systems, and in industrial read-out equipment. Furthermore, logarithmic amplifiers have been combined with analog to digital converters to provide digitized logarithmic information for use in process controls.

Some of the most common problems encountered in the construction of prior art logarithmic amplifiers, particularly of the semiconductor diode type, are their freqeuncy band pass capabilities, their dynamic ranges, their thermal stability, and the effects of high repetitive rate monopolar signals on the operation amplifier. These problems are particularly critical in situations wherein both a frequency cutoff greater than a few megacycles and dynamic ranges over a few decades are desired.

Accordingly, applicant has invented a new and improved logarithmic amplifier having the capabilities for overcoming the limitations of the prior art.

In view of the foregoing, it is an object of this invention to provide a new and improved logarithmic amplifying device.

It is a further object of this invention to provide a new and improved amplifier having both a wide dynamic range and a wide frequency band pass.

It is an additional object of this invention to provide a new and improved logarithmic amplifier having means for compensating for monopolar signal effects.

Other objects of this invention will in part be obvious and will in part appear hereinafter.

In accordance with this invention, a new and improved logarithmic amplifier is provided. In the preferred embodiments of this invention a semiconductor diode having a logarithmic I–V characteristic is DC biased with a constant current. Additionally, a reference means is provided to keep the DC current bias through the diode constant regardless of the frequency rate, amplitude and sign of the signals applied to the input of the amplifier.

The invention accordingly comprises the features of construction, combination of elements and arrangement of parts which will be exemplified in the amplifiers hereinafter set forth and the scope of the invention will be indicated in the claims.

For a fuller understanding of the nature and objects of the invention, reference is had to the following detailed description, taken in conjunction with the accompanying drawings, in which:

FIG. 1 is a schematic diagram of a logarithmic amplifier according to this invention; and FIG. 2 is another embodiment in schematic form of a logarithmic amplifier according to this invention.

Referring now to FIG. 1, there is shown an NPN transistor 10 having a base 11, an emitter 12 and a collector 13. The base 11 of transistor 10 is connected to an input signal circuit comprising a capacitor 16 and a resistor 18. Connected to emitter 12 is a current limiting resistor 19. Coupled to the collector 13 is a diode 20, preferably of semiconductor material, having a logarithmic I–V characteristic curve (hereinafter sometimes referred to as logarithmic diode). Transistor 10 acts to bias the diode 20 at a constant current in order to set the quiescent operating point on the diode I–V curve. The application of an input signal to transistor 10 will instantaneously alter the DC current flowing through diode 20 and produce an output voltage variation across the diode which represents the logarithm of the input signal. With the application of only monopolar pulses, the output voltage characteristic of the diode 20 will change with the input signal amplitude and rate, since the monopolar signal current effectively changes the average DC current used to bias diode 20. In effect, the DC bias current changes with both input signal rate and input signal amplitude.

In order to eliminate the undesirable change in average DC bias current, a reference feedback loop has been provided to maintain a constant average DC bias current in the logarithmic diode 20. This has been accomplished by establishing a reference current thorugh a reference diode 30, preferably of the semiconductor type and also preferably having a logarithmic I–V characteristic curve, and comparing the voltage drop across the diode 30 with that of diode 20. A difference signal representing a comparison between the voltage drops across the two diodes is utilized as a feedback signal to maintain the average DC bias current in the diode 20 equal to the current in the reference diode 30. The diode 30 is coupled to ground through a current limiting resistor 32.

To provide the difference signal to control the current provided by transistor 10 to diode 20, a pair of NPN transistors 33 and 34 is connected as a differential signal amplifier. Transistor 33 has a base 35, emitter 36 and collector 37, and transistor 34 has a base 39, emitter 40 and collector 41. The base 35 is coupled to diode 20 and collector 13 of transistor 10, and the base 39 of transistor 34 is connected to diode 30. The emitters 36 and 40 of transistors 33 and 34 are both coupled to an output circuit comprising a resistor 43 and a capacitor 44. The collector 37 of transistor 33 is coupled to one side of a differential resistor 45 and the collector 41 of transistor 34 is coupled to the other side of resistor 45. A signal representing the difference in potential across the two diodes is then coupled from resistor 45 to a PNP transistor 50 which acts to vary the biasing of transistor 10 in such a manner as to keep the DC bias current flowing in diode 20 constant regardless of input signal rate, amplitude or sign.

Transistor 50 includes a base 51, a collector 52 and an emitter 53. The base 51 is connected to the resistor 45 and the collector 52 is coupled to a feedback resistor 55 which is in series with input resistor 18. The junction of resistors 18 and 55 is coupled to a voltage source $V_3$. Thus, by the use of a reference circuit means including a reference diode 30 and a differential feedback loop coupled in a manner to alter the DC current flow in diode 20 in accordance with the voltage drop across the diode 20, a new and improved logarithmic and/or nonlinear amplifier has been provided which was a substantially constant output characteristic substantially regardless of the sign, rate or amplitude of the input signals.

Referring now to FIG. 2, there is shown another embodiment of a logarithmic amplifier according to this invention, including an improved means for providing a constant current to the logarithmic characteristic diode and an improved impedance matching means for limiting the current drawn by the differential diode voltage drop comparison means. Further, this embodiment includes means for increasing the frequency band pass of the amplifier by applying boot-strapping techniques. The amplifier of FIG. 2 comprises a constant bias current source which includes transistors 70, 71 and 72. These transistors are coupled in a manner adapted to provide substantially a constant DC bias current to a diode 75. The diode 75 is chosen to have a logarithmic I–V characteristic curve. Transistor 70 includes a base 80, an emitter 81 and a collector 82. Transistor 71 includes a base 83, an emitter 84 and a collector 85, and transistor 72 includes a base 86, an emitter 87 and a collector 88. The base 80 of transistor 70 is coupled to an input circuit comprising a capacitor 89 and a resistor 90. The emitter 81 of transistor 70 is coupled to a load resistor 91 and to the emitter 84 of transistor 71. The collector 85 of transistor 71 is connected to the base 86 of transistor 72 and to a load resistor 93. The load resistor 93 is coupled back for instantaneous signals to the base 83 and the emitter 87 of transistors 71 and 72, respectively, by a capacitor 94 and is also coupled through a resistor 95 to a source of voltage $V_1$. The base 83 and the emitter 87 of transistors 71 and 72, respectively, are also coupled through a current limiting resistor 96 to ground. Further, the collector 88 of transistor 72 is coupled through load resistors 98 and 99 to the source of voltage $V_1$ and is also coupled to the logarithmic characteristic diode 75. The transistor 70 functions as an emitter follower and the transistor 71 which is coupled to transistor 72 functions in a manner to compensate for changes in the beta of transistor 72, so that transistor 72 will provide an output signal at point 100 which is equal to and directly proportional to an instantaneous change in input signal applied at the input of transistor 70.

The diode 75 is coupled through a resistor 101 to the source of bias voltage $V_1$. The curent flowing through the diode 75 is therefore related to the values of the resistors 98, 99 and 101. The diode 75 is also coupled through a bypass network comprising a resistor 102 and a capacitor 103 to ground. Also coupled to diode 75 are three emitter follower transistors 109, 110 and 111 which act as an impedance matching network in a Darlington arrangement as well as a means for coupling the voltage change across the diode 75 to a utilization device. Thus, with the application of an input signal applied to transistor 70, the instantaneous current flowing through diode 75 will change and an output signal which represents the logarithm of the input signal will be obtained at the emitter of the emitter follower transisor 111 across a load resistor 112.

With the application of substantially only monopolar input signals or pulses to the logarithmic amplifier, the output voltage characteristics of diode 75 will change in accordance with input signal amplitude and rate since the monopolar input signal pulses effectively change the average DC current used to bias diode 75.

In order to eliminate the undesirable change in DC bias current, a reference feedback loop has been provided to maintain a constant average DC bias current in the logarithmic diode 75. This has been accomplished by establishing a reference current through a refrence diode 120, preferably also of the semiconductor type and also preferably having a logarithmic I–V characteristic curve, and a comparing of the voltage drop across the diode 120 with that of the diode 75. A difference signal representing a comparison between the voltage drops across the two diodes is utilized as a feedback signal to maintain the average DC bias current in the diode 75 equal to current in the reference diode 120. The current in the reference diode 120 is established by the connection of one side of diode 120 to the resistor 101 and the coupling of the other side of the diode to ground through a current limiting resistor 121.

To generate the difference signal, a differential amplifier circuit 129 comprising two transistors 130 and 131 is provided. The transistor 130 is coupled via the impedance matching transistors 109 and 110 to detect the voltage drop across diode 75 and transistor 131 is coupled via a pair of impedance matching transistors 135 and 136 to detect the voltage drop across diode 120. An output difference signal from the differential amplifier circuit 129 is then obtained across a differential resistor 140. The difference signal is then applied to a feedback transistor 150 which is coupled through a resistor 151*a* in a manner to control the base current applied to current source transistors 70, 71 and 72. In this manner the average DC bias current flowing through diode 75 is maintained substantially constant regardless of the amplitude, sign and frequency of the input signal.

Additionally, the circuit of FIG. 2 utilizes boot-strapping techniques to increase the band pass of the logarithmic amplifier. In particular, by the use of a capacitor 150*a* which is connected to emitter 151 of transistor 109 by way of resistor 152, and which is also coupled to emitter 153 of transistor 110 by way of resistor 154, the base to collector capacitance of transistors 109 and 110 are compensated for in such a manner as to substantially increase the upper frequency cutoff limit of these transistors. Thus, the band pass of the amplifier is therefore substantially increased. Further, by the use of a second bootstrapping capacitor 160 which instantaneously couples back to the junction of resistors 98 and 99 a signal substantially equal to magnitude and sign to that which appears at the point 100 as a result of an input pulse signal applied to the amplifier, the response of the amplifier to a varying input signal is substantially improved. By boot-strapping the resistor 98, the varying input current is only permitted to flow into the diode 75 and not through resistors 98 and 99 since the potential at point 100 is the same as the potential at the junction of resistors 98 and 99.

While it will be understood that the circuit specifications may vary according to the design for any particular application, the following circuit specifications are included for the circuit of FIG. 2, by way of example only:

| | | |
|---|---|---|
| Transistors **70**, **71**, **72**, **109**, **110**, **111**, **130**, **131** and **135** | | 2N2926G |
| Transistor **150** | | 2N3250 |
| Diodes **75** and **120** | | 1N4009 |
| Resistors **96** and **98** | ohms | 33000 |
| Resistors **99** and **101** | do | 1000 |
| Resistor **121** | do | $10\times10^6$ |
| Resistor **140** | do | 4700 |
| Capacitor **150** | microfarad | .01 |
| Capacitor **160** | do | .1 |

Further, it is to be understood that other embodiments of this invention could include NPN transistors instead of PNP transistors, or vice versa.

It will thus be seen that the objects set forth above, among those made apparent from the preceding description, are efficiently attained and since certain changes may be made in the above constructions without departing from the scope of the invention, it is intended that all matter contained in the above description or shown in the accompanying drawing shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed is:

1. In combination, a first logarithmic semiconductor diode, first means for providing a DC bias current flow through said diode, second means including a capacitor for coupling an input pulsating signal to said first means, a second logarithmic semiconductor diode, third means for providing a DC bias current flow through said second diode, means for generating signals indicative of the DC average current flowing through both of said first and second diodes, means for comparing said last mentioned signals to provide a difference signal, and means coupled to said first means and responsive to said difference signal to maintain the average DC bias current substantially constant regardless of the rate of the input signal.

2. A circuit comprising in combination, input terminal means for connection to means providing an input signal, a current source coupled to the input terminal means, a logarithmic diode coupled to said current source, a reference diode, a differential amplifier coupled to both of said diodes, and an energy conversion device responsive to a different signal representative of the difference in voltages across said diodes generated by said differential amplifier for maintaining the average DC current from said source provided through said logarithmic diode substantially equal to the average DC current flowing in said reference diode, said current source including at least first and second transistors, the first of which has its collector coupled in series with said logarithmic diode and the second of which is coupled to said first transistor, the base of said first transistor being coupled to the collector of said second transistor, the base of said second transistor being coupled to the emitter of said first transistor in order to compensate for changes in beta of the first transistor, and the emitter of said second transistor coupled to said energy conversion device.

3. A circuit comprising in combination, input terminal means for connection to means providing an input signal, a current source coupled to the input terminal means, a logarithmic diode coupled to said current source, a reference diode, a differential amplifier coupled to both of said diodes, and an energy conversion device responsive to a different signal representative of the difference in voltages across said diodes generated by said differential amplifier for maintaining the average DC current from said source provided through said logarithmic diode substantially equal to the average DC current flowing in said reference diode, wherein at least one emitter follower transistor is coupled between said logarithmic diode and said differential amplifier, wherein at least one emitter follower transistor is coupled between said reference diode and said differential amplifier, and wherein the capacitor is coupled to provide a signal from the emitter of said emitter follower coupled to said logarithmic diode to the collector of the same emitter follower to compensate for the base to collector capacitance of the same emitter follower.

4. A circuit in accordance with claim 3, wherein said energy conversion device is a transistor of an opposite polarity type than at least one of said current source transistors.

References Cited

UNITED STATES PATENTS

| | | | |
|---|---|---|---|
| 2,877,348 | 3/1959 | Wade et al. | 330—110 |
| 2,903,524 | 9/1959 | Howell | 328—145 |
| 3,058,057 | 10/1962 | Frost | 328—145 |
| 3,108,197 | 10/1963 | Levin | 307—88.5 |

ARTHUR GAUSS, *Primary Examiner.*

H. A. DIXON, *Assistant Examiner.*

U.S. Cl. X.R.

328—145